(12) United States Patent
Mohanasundaram et al.

(10) Patent No.: US 11,770,912 B2
(45) Date of Patent: Sep. 26, 2023

(54) COMPUTING UNIT FOR A HPC CABINET AND A METHOD FOR ACCESSING AN ELECTRONIC COMPONENT FROM THE COMPUTING UNIT

(71) Applicant: BULL SAS, Les Clayes-sous-Bois (FR)

(72) Inventors: Sakthivel Mohanasundaram, Thanjavur (IN); Mohanakumara Prakasha, Karnataka (IN)

(73) Assignee: BULL SAS, Les Clayes-sous-Bois (FR)

( * ) Notice: Subject to any disclaimer, the term of this patent is extended or adjusted under 35 U.S.C. 154(b) by 0 days.

(21) Appl. No.: 17/720,738

(22) Filed: Apr. 14, 2022

(65) Prior Publication Data
US 2022/0346262 A1    Oct. 27, 2022

(30) Foreign Application Priority Data

Apr. 27, 2021  (EP) .................................... 21170707

(51) Int. Cl.
*H05K 7/14* (2006.01)
*H05K 5/02* (2006.01)

(52) U.S. Cl.
CPC ......... *H05K 7/1487* (2013.01); *H05K 5/0221* (2013.01); *H05K 7/1409* (2013.01); *H05K 7/1489* (2013.01); *H05K 7/1492* (2013.01)

(58) Field of Classification Search
CPC .. H05K 7/1402; H05K 7/1405; H05K 7/1409; H05K 7/1411; H05K 7/1415; H05K 7/1487; H05K 7/1489; H05K 7/1492
See application file for complete search history.

(56) References Cited

U.S. PATENT DOCUMENTS

| | | | | |
|---|---|---|---|---|
| 4,632,588 A | * | 12/1986 | Fitzpatrick ........... | H05K 7/1409 403/321 |
| 6,058,579 A | * | 5/2000 | Brocklesby .......... | H05K 7/1409 340/687 |
| 6,579,029 B1 | * | 6/2003 | Sevde .................. | H05K 7/1414 403/321 |
| 2002/0090851 A1 | | 7/2002 | Wrycraft | |
| 2005/0014403 A1 | * | 1/2005 | Joist ..................... | H05K 7/1409 439/157 |
| 2006/0134953 A1 | * | 6/2006 | Williams ............. | H05K 7/1411 439/157 |
| 2007/0149018 A1 | | 6/2007 | Gunther et al. | |

(Continued)

OTHER PUBLICATIONS

European Search Report issued in EP21170707.0, dated Oct. 26, 2021 (5 pages).

*Primary Examiner* — Adrian S Wilson
*Assistant Examiner* — Gage Crum
(74) *Attorney, Agent, or Firm* — ARC IP LAW, PC; Joseph J. Mayo

(57) ABSTRACT

A computing unit configured to be mounted in a HPC cabinet comprising an external body and an internal body that comprises secondary electronic components. The internal body being releasably coupled with the external body in order to allow extraction of the internal body when the external body is secured fixedly to the HPC cabinet. The computing unit also includes at least one front lever pivotally coupled to the internal body and configured to latch with a latching wall of the external body and to latch with the bottom wall of the external body in order to releasably couple the internal body with the external body.

12 Claims, 6 Drawing Sheets

(56) References Cited

U.S. PATENT DOCUMENTS

| | | | | |
|---|---|---|---|---|
| 2007/0258224 | A1* | 11/2007 | Fang | H05K 7/1409 361/759 |
| 2012/0242203 | A1* | 9/2012 | Gong | G06F 1/187 312/223.2 |
| 2012/0248952 | A1* | 10/2012 | Gong | H05K 7/1494 312/244 |
| 2021/0315125 | A1* | 10/2021 | Lin | A47B 88/487 |

* cited by examiner

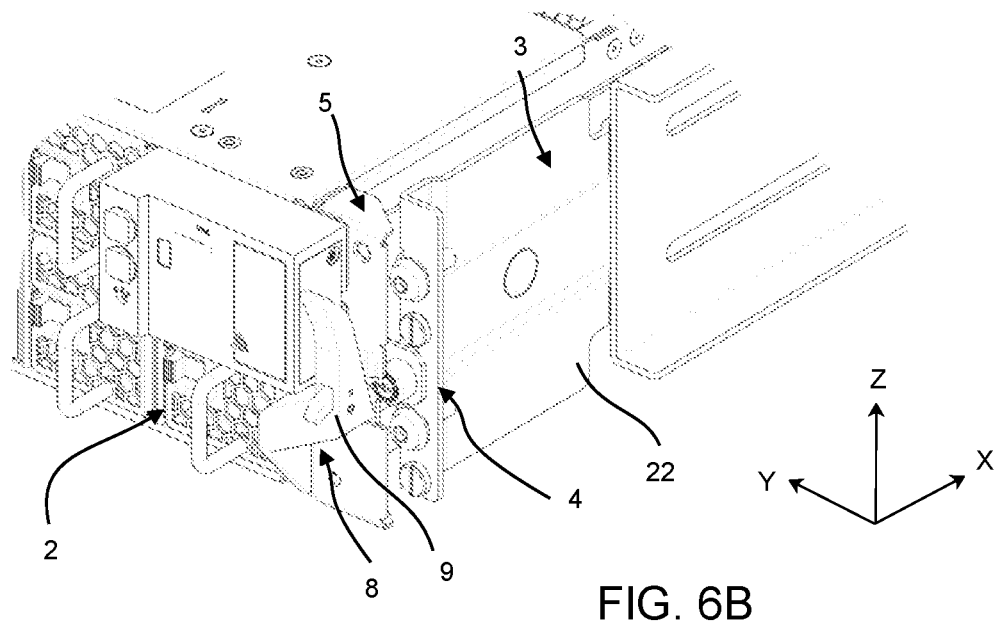
FIG. 6B
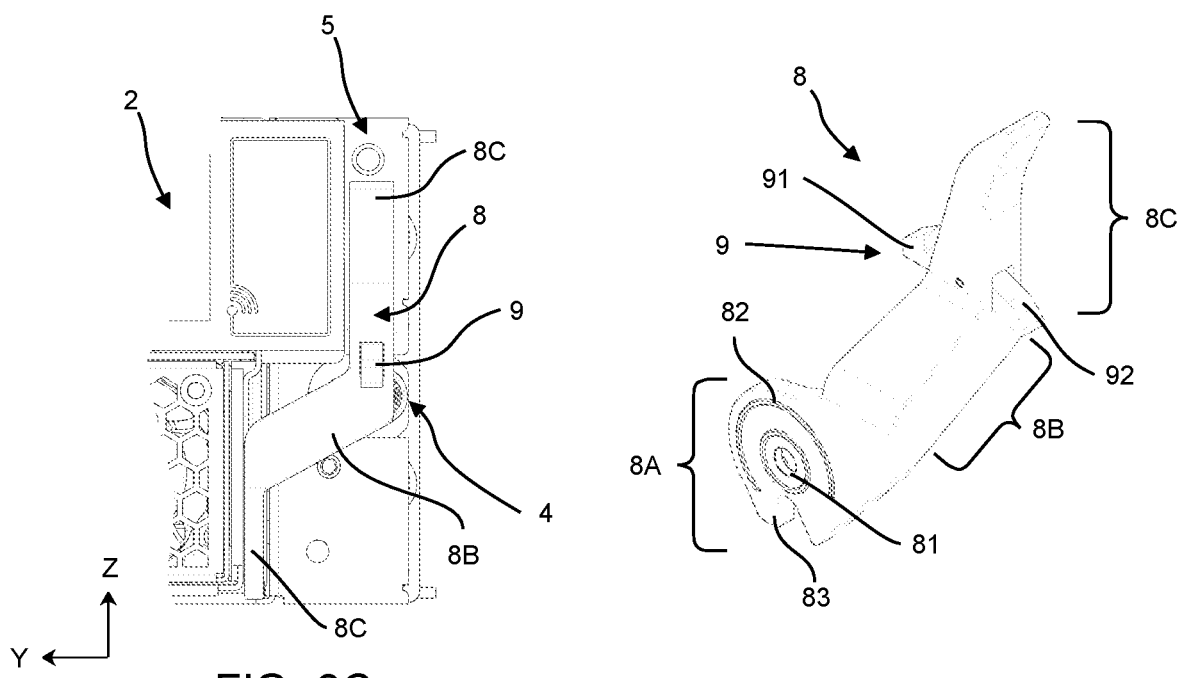
FIG. 6C
FIG. 7

COMPUTING UNIT FOR A HPC CABINET AND A METHOD FOR ACCESSING AN ELECTRONIC COMPONENT FROM THE COMPUTING UNIT

This application claims priority to European Patent Application Number 21170707.0, filed 27 Apr. 2021, the specification of which is hereby incorporated herein by reference.

BACKGROUND OF THE INVENTION

Field of the Invention

Embodiments of the invention relate, in general, to a high-performance computing and, more specifically relates, to a computing unit for a high-performance computing cabinet and a method for accessing an electronic component from the computing unit.

A datacenter comprises several high-performance computing cabinets, called HPC cabinets or "clusters", arranged in rows within the datacenter and configured to house computing units, such as servers, switches and routers, to organize, process and store data. Each computing unit comprises conventionally at least one mother board and several components secured to the mother board such as processors, Dual In-Line Memory Module (DIMM), a PCIe component (GPU, FPGAs)), fans, etc.

High performance computing has gained importance in recent years by several industries which are trending towards increasing sizes or combinations of two or more servers to achieve faster processing performance for a large number of processing operations. Solutions known to address such requirement of the industries include Ultra Path Interconnect (UPI) technology which provides a scalable multiprocessor system, for example, by linking motherboards of two or more computing units together. However, users face several issues which either require a maintenance activity to be carried out on the computing units and may often include replacement of few components in the computing units.

A HPC cabinet comprises traditionally two vertical side walls delimiting a central cavity with a front opening, so as to define vertically stacked sockets having a standard height (U). A computing unit is configured to be housed in the HPC cabinet and mounted onto the two vertical side walls. The height of the computing device is usually comprised between 1 U and 6 U.

Each vertical side wall comprises a front portion which is configured to cooperate with an abutment wall of the computing unit. Usually, the front portion of each side wall comprises threaded openings and the abutment wall of the computing unit comprises screws which are configured to be screwed into the threaded openings so that the computing unit is secured fixedly to the HPC cabinet. Besides its mechanical mounting, each computing unit is also connected to a power distribution unit, known as PDU, and to a network thanks to a management node (not represented) located within the HPC cabinet.

Currently, in order to access a faulty electronic component of the computing unit, the user must unscrew the computing unit from the HPC cabinet. Thus, a user must invest a large amount of time by using multiple tools (screw drivers, etc.), which renders replacement activity complex. Using multiple tools demand knowledge of use of such tools to prevent any damage. As such, user ergonomics and convenience may be affected, thereby violating principles of customer replaceable unit (CRU).

Accordingly, it is one object of one or more embodiments to provide a user-friendly computing unit which reduces effort and time to be invested by the user.

BRIEF SUMMARY OF THE INVENTION

A computing unit configured to be mounted in a High-Performance Computing cabinet, thereafter HPC cabinet, defining a plurality of vertically stacked sockets, the computing unit according to one or more embodiments comprising:
- an external body, comprising primary electronic components, configured to engage with at least one of the sockets, the external body comprising at least a bottom wall and two lateral walls defining a housing opened from the front, each lateral side comprising an abutment wall configured to be secured directly to the HPC cabinet and a latching wall located in front of the abutment wall, the external body comprising at least a first connector connected to the primary electronic components,
- an internal body, comprising secondary electronic components, the internal body being releasably coupled with the external body in order to allow extraction of the internal body when the external body is secured fixedly to the HPC cabinet, the internal body comprising at least a second connector connected to the secondary electronic components, the second connector being configured to cooperate with the first connector when the internal body is coupled with the external body,
- at least one front lever pivotally coupled to the internal body and configured to latch with a latching wall of the external body and to latch with the bottom wall of the external body in order to releasably couple the internal body with the external body when the internal body is located within the housing of the external body.

In at least one embodiment of the invention, the computing unit can be secured fixedly to the HPC cabinet as in the prior art but the internal body can be pulled out without requiring removing the external body. The use of a front lever avoids using tools which increases maintenance efficiency. The use of two matching points for each front lever allows performing a tight coupling without hardship for the user.

In at least one embodiment, the latching wall comprises at least a reception element, located on the back face of the latching wall, configured to cooperate with the front lever. The reception element can retain the front lever which acts as a hook.

According to one or more embodiments, the latching wall comprises at least one through opening, preferably a notch, said reception element being located at the periphery of the through opening. The front lever can therefore move within the through opening before being retained by the reception element.

In one or more embodiments, the abutment wall comprises at least a locking member accessible from the front of the computing unit through the through opening of the latching wall. The locking member is always accessible even with the presence of the latching wall.

According to at least one embodiment, the front lever comprises at least an actuator comprising a first end for cooperating with the latching wall and a second end configured to be manipulated manually by a user without tools so that to modify the inclination of the actuator, the actuator being pivotable between an engaged position for securing the internal body to the external body and a disengaged position. Any accidental removal of the internal body is therefore avoided.

In one or more embodiments, the front lever comprises at least a biasing member configured to retain the actuator in the engaged position.

In at least one embodiment, the bottom wall comprises at least a through opening and the front lever comprises at least a latching tooth configured to cooperate with the through opening in order to push the internal body within the external body when rotating the front lever to the rear.

According to one or more embodiments, the front lever comprises a bottom arm configured to latch with the bottom wall and a top arm configured to latch with the latching wall of the external body. In at least one embodiment, the bottom arm and the top arm of the front lever are laterally offset.

In at least one embodiment, the computing unit comprises two front levers, one at each side of the internal body so that the front levers can be used simultaneously to pull the internal body.

One or more embodiments of the invention relates also to a method for accessing a second electronic component from the internal body of a computing unit as presented before, the internal body being located in the housing of the external body, the front lever being latched with the latching wall of the external body, the method comprising:
  Pivoting the front lever to unlatch the external body and
  Pulling the internal body out from the housing of the external body in order to access the second electronic component from the internal body.

BRIEF DESCRIPTION OF THE DRAWINGS

A better understanding of embodiments of the invention (including alternatives and/or variations thereof) may be obtained with reference to the detailed description of the embodiments along with the following drawings, in which:

FIG. 6B is an isometric view of the right front lever from FIG. 6A when coupling the internal body with the external body, according to one or more embodiments.

FIG. 6C is a front view of the right front lever from FIG. 6B in the coupling position, according to one or more embodiments.

FIG. 7 is an isometric view of the right front lever, according to one or more embodiments.

DETAILED DESCRIPTION OF THE INVENTION

Reference will now be made in detail to specific embodiments or features, examples of which are illustrated in the accompanying drawings. Wherever possible, corresponding or similar reference numbers will be used throughout the drawings to refer to the same or corresponding parts. Moreover, references to various elements described herein are made collectively or individually when there may be more than one element of the same type. However, such references are merely exemplary in nature. It may be noted that any reference to elements in the singular may also be construed to relate to the plural and vice-versa without limiting the scope of the invention to the exact number or type of such elements unless set forth explicitly in the appended claims.

According to one or more embodiments, a datacenter comprises several high-performance computing cabinets, called HPC cabinets or "clusters", arranged in rows within the datacenter and configured to house computing units, such as servers, switches and routers, to organize, process and store data. A HPC cabinet is configured to accommodate multiple server units, switches, cords and cables, rails, cable management bars, routers, path panels, and blanking panels.

High performance computing has gained importance in recent years by several industries which are trending towards increasing sizes or combinations of two or more servers to achieve faster processing performance for a large number of processing operations. Solutions known to address such requirement of the industries include Ultra Path Interconnect (UPI) technology which provides a scalable multiprocessor system, for example, by linking motherboards of two or more computing units together.

Figure 1:
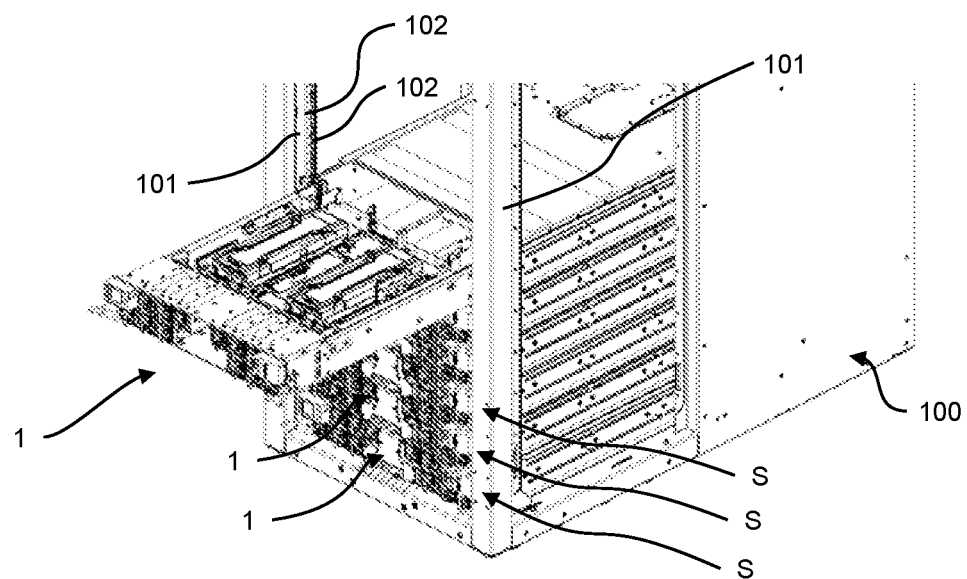
FIG. 1 is an isometric view of a HPC cabinet comprising several computing units, according to one or more embodiments.

As illustrated in FIG. 1, according to one or more embodiments, a HPC cabinet 100 comprises two vertical side walls 101, delimiting a central cavity with a front opening, so as to define vertically stacked sockets S having a standard height (U). Several computing units 1 are housed in the HPC cabinet 100 and mounted onto the two vertical side walls 101. In at least one embodiment, the height of each computing device 1 is 2 U but could be different.

Each vertical side wall 101 comprises a front portion which is configured to cooperate with an abutment wall of a computing unit 1. In at least one embodiment, the front portion of each side wall 101 comprises threaded openings 102. Such an HPC cabinet 100 is known from the prior art and won't be further detailed.

A computing unit 1 according to one or more embodiments of the invention will be now presented. In at least one embodiment, as represented in FIGS. 2, 3 and 4, the computing unit 1 comprises an internal body 3 mounted within an external body 2, the internal body 3 being releasably coupled to the external body 2 in order to allow extraction of the internal body 3 when the external body 2 is fixedly secured to the HPC cabinet 100.

Figure 2:
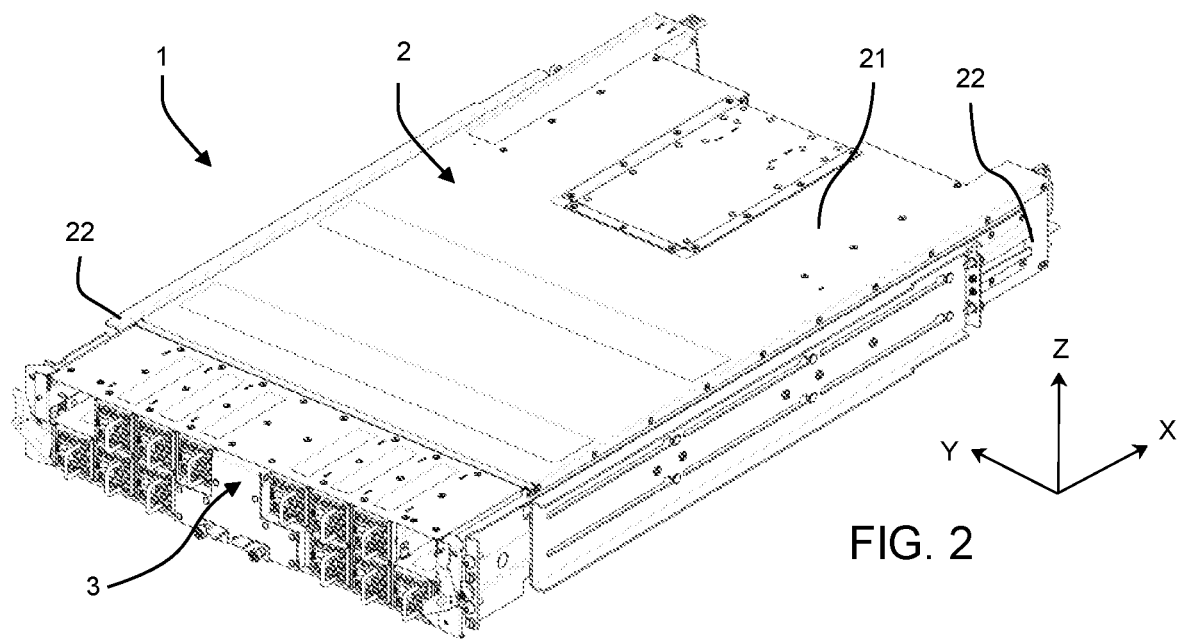
FIG. 2 is an isometric view of a computing unit, according to one or more embodiments.
Figure 3:
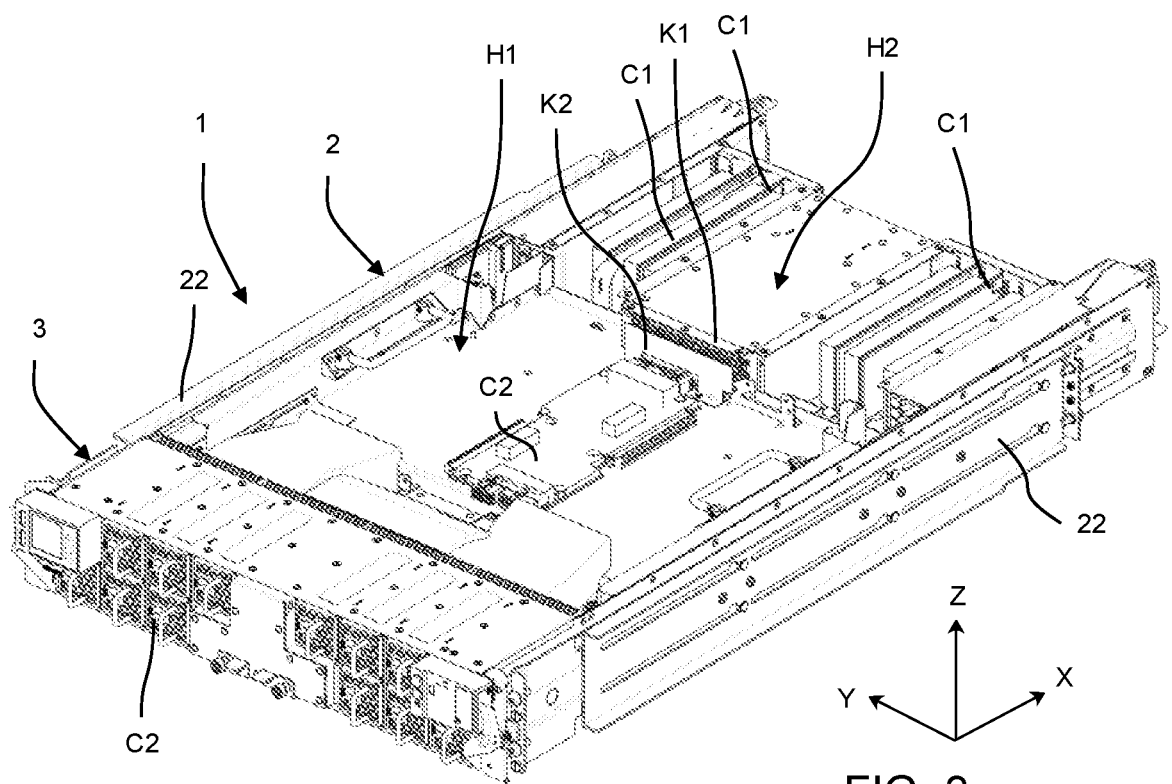
FIG. 3 is an isometric view of the computing unit from FIG. 2 without the top wall of the external body, according to one or more embodiments.
Figure 4:
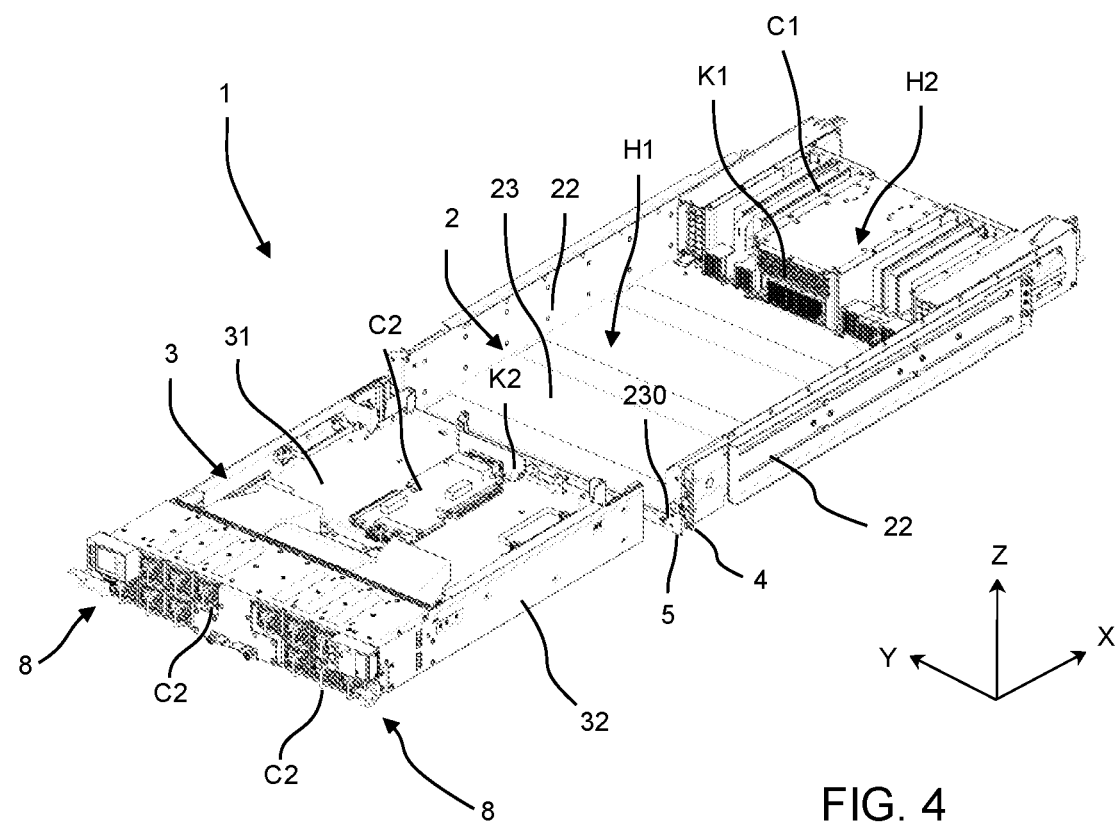
FIG. 4 is an isometric view of the computing from FIG. 3 with the internal body in the extracted position, according to one or more embodiments.

As illustrated in FIGS. 2 to 4, according to one or more embodiments, the computing unit 1 is presented in the (X, Y, Z) referential in which the X axis extends longitudinally from the front to the rear, the Y axis extends laterally from the right to the left and the Z axis extends vertically from the bottom to the top.

According to one or more embodiments of the invention, the external body 2 comprise lateral walls 22, a bottom wall 23 (See FIG. 4) and a top wall 21 defining together a housing (the top wall 21 is not represented in the FIGS. 3 and 4). As represented in FIGS. 3 and 4, the external body 2 defines a front housing H1 where the internal body 3 can be mounted and a back housing H2 where primary electronic components C1 are located, for example, at least one mother board and components secured to the mother board such as processors, Dual In-Line Memory Module (DIMM), etc. The internal body 3 is configured to be releasably coupled to the primary electronic components C1 from the back housing H2. The external body 2 comprises at least a first connector K1 connected to the primary electronic components C1. The first connector K1 is located at the interface between the first housing H1 and the second housing H2.

As represented in FIGS. 4 et 5, according to one or more embodiments, each lateral wall 22 of the external body 2 comprises an abutment wall 4 configured to be connected to the HPC cabinet 100. Each abutment wall 4 is located in a front end of the external body 2.

Figure 5:
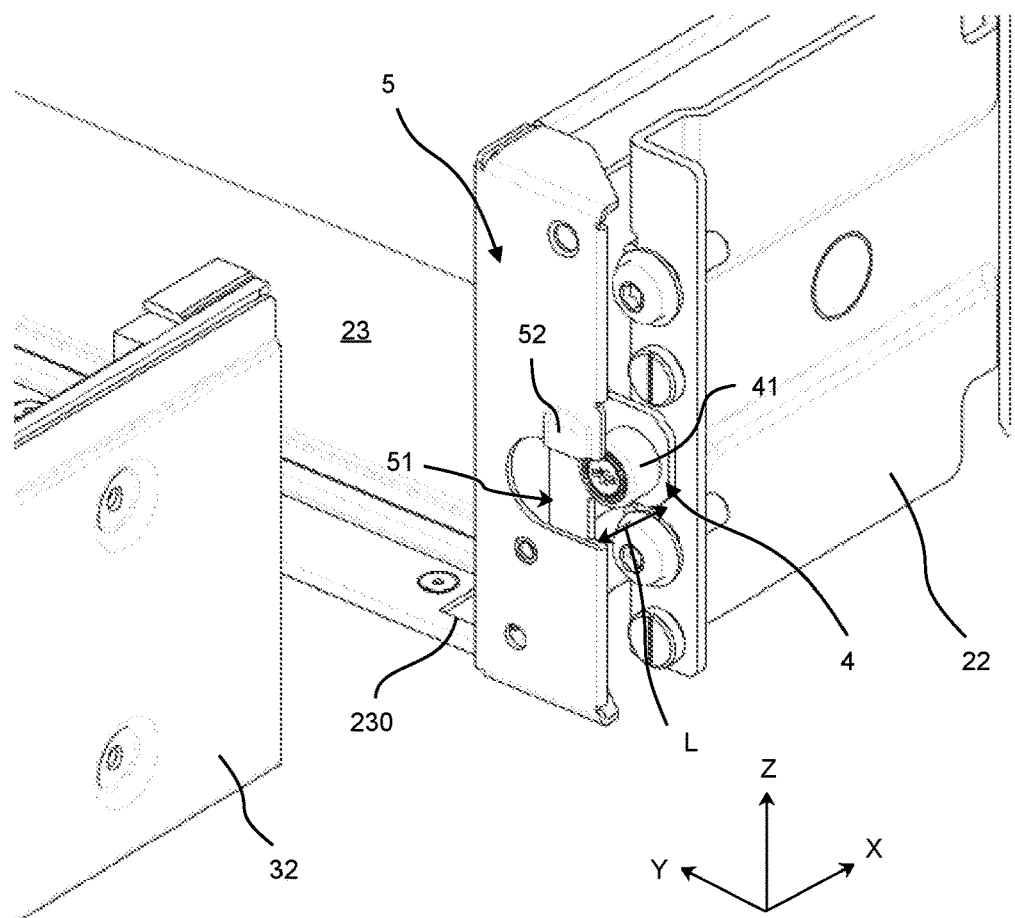
FIG. 5 is an isometric view of the abutment wall and of the latching wall of the right side of the external body from FIG. 4, according to one or more embodiments.

The abutment wall 4 from the right side will be now described in reference to FIG. 5, according to one or more embodiments. The description of the left side is similar and won't be presented in details. The abutment wall 4 extends laterally to the right from the side wall 22. The abutment wall 4 extends vertically in a YZ plane as represented in FIG. 5, preferably along the entire height of the computing unit 1.

The abutment wall 4 comprises a locking member 41, preferably, a captive screw. The abutment wall 4 is configured to abut to a vertical side wall 101 of the HPC cabinet 100 which comprises several threaded openings 102 in order to retain the locking member 41. In other words, thanks to the abutment wall 4, the external body 2 can be secured fixedly to the HPC cabinet 100 as in the prior art.

The external body 2 comprises also a latching wall 5 extending in front of the abutment wall 4. In at least one embodiment, the latching wall 5 and the abutment wall 4 are longitudinally spaced apart from a distance L, defined along the X axis, which is comprised between 14 and 22 mm, preferably 18 mm. The latching wall 5 is parallel to the abutment wall 4 and extends preferably along the entire height of the computing unit 1. In at least one embodiment, the latching wall 5 and the abutment wall 4 are fixed relatively to each other.

The latching wall 5 comprises a trough opening 51, preferably a cutout or a notch, which is aligned longitudinally, along the X axis, with the locking member 41 from the abutment wall 4. A user can therefore access the locking member 41 from the front, for example with a screwdriver, in order to secure the external body 2 to the HPC cabinet 100. By way of at least one embodiment of the invention, this operation is performed only during the first mounting or for heavy maintenance.

The latching wall 5 also comprises a reception element 52, located on the back face of the latching wall 5, configured to cooperate with a front lever 8 according to one or more embodiments of the invention. In at least one embodiment, the reception element 52 is located at the periphery of the trough opening 51. The reception element 52 is preferably located directly over the through opening 51. The reception element 52 defines a recess in the back face of the latching wall 5 so that a part of the front lever 8 can be securely located in the recess when the internal body 3 and the external body 2 are coupled together.

As represented in FIG. 5, according to at least one embodiment, the external body 2 comprises also a through opening 230 located on each side of the bottom wall 23 of the external body 2 so that each front lever 8 can latch with the external body 2 according to two latching points. The cooperation of the internal body 3 with the external body 2 is very stable even with the releasable coupling.

As represented in FIG. 4, according to one or more embodiments, the internal body 3 comprises a bottom wall 31 and side walls 32. The internal body 3 further comprises a motherboard connected to several secondary electronic components C2. In at least one embodiment, the internal body 3 comprises for example, processors, Dual In-Line Memory Module (DIMM), a PCIe component (GPU, FPGAs)), fans.

The internal body 3 comprises at least a second connector K2 connected to the secondary electronic components C2; the second connector K2 being configured to cooperate with the first connector K1 when the internal body 2 is coupled with the external body 3 (See FIG. 3). The second connector K2 is located at the rear end of the internal body 3.

In at least one embodiment, as represented in FIG. 4, the computing unit 1 comprises, at each side of the internal body 3, a front lever 8 pivotally coupled to the internal body 3 and configured to latch:
 with the corresponding latching wall 5 of the external body 2 and
 with the corresponding through opening 230 from the bottom wall 23 in order to releasably couple the internal body 3 with the external body 2.

The internal body 3 comprises two front levers 8 capable of being pivotably deflected by a user to allow detachment of the internal body 3 from the external body 2. Likewise, the front levers 8 also enable the user to push the internal body 3 back into the external body 2. The front levers 8 eliminate use of any external tools to couple and uncouple the internal body 3. The front lever 8 from the right side will be now described. The description of the left side is similar and won't be presented in details.

Figure 6A:
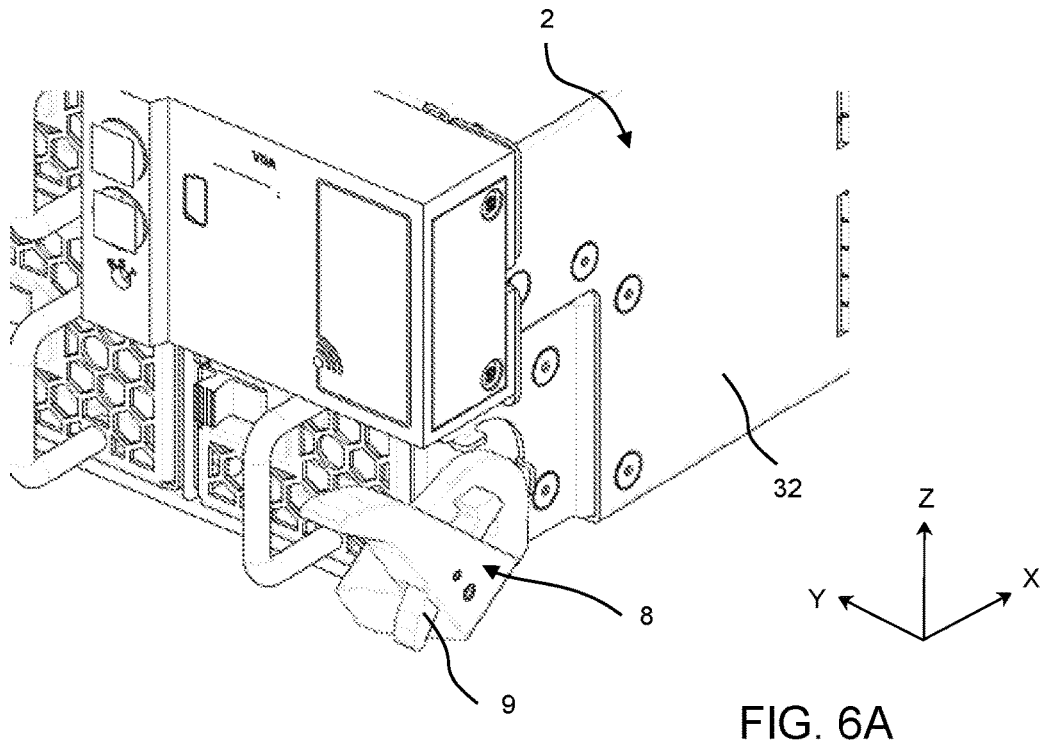
FIG. 6A is an isometric view of the right front lever from FIG. 4 in the coupling position, according to one or more embodiments.

The front lever 8 is coupled at the front end of the internal body 3 and is pivotable along a lateral axis Y so that the front lever 8 can be moved from the rear to the front and reciprocally. As it will be presented later, according to one or more embodiments, the rear position corresponds to an uncoupling position (FIG. 6A) whereas the front position corresponds to a coupling position (FIGS. 6B and 6C).

A front lever 8 is represented schematically in FIG. 7, according to one or more embodiments. The front lever 8 has a longitudinal shape and comprise a bottom arm 8A with a pivot joint 81, an intermediate arm 8B and a top arm 8C with an actuator 9 for cooperating with the latching wall 5 of the external body 2.

Figure 8A:
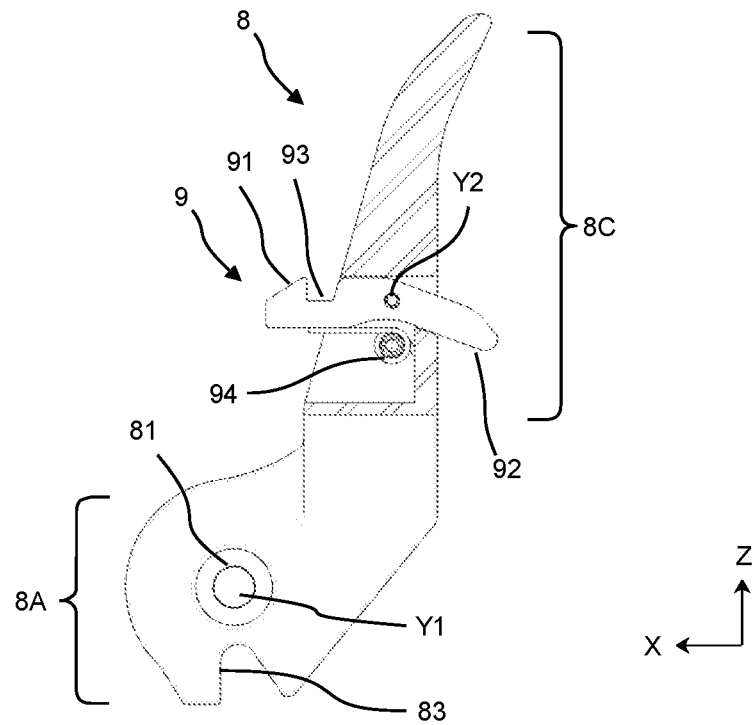
FIG. 8A is a cross-sectional view of the right front lever with the actuator in the engaged position, according to one or more embodiments.
Figure 8B:
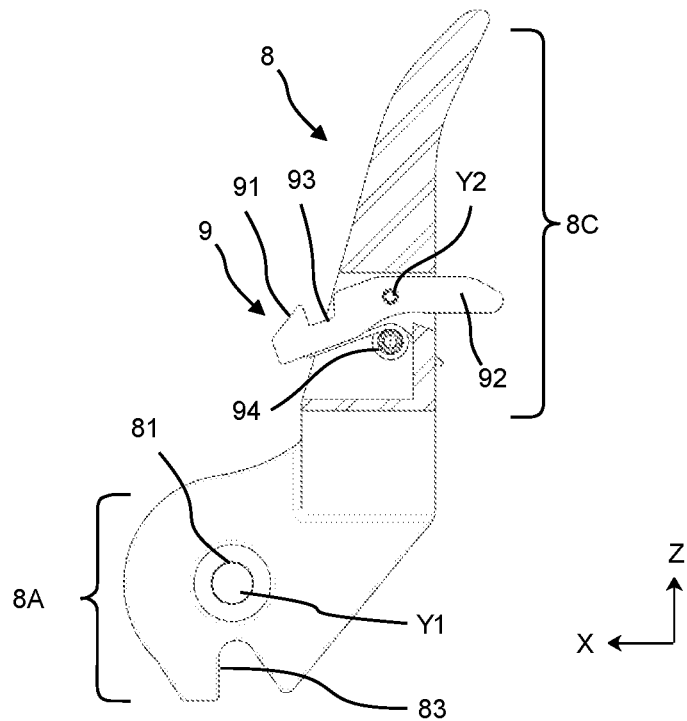
FIG. 8B is a cross-sectional view of the right front lever with the actuator in the disengaged position, according to one or more embodiments.

In at least one embodiment, as represented in FIGS. 7, 8A and 8B, the bottom arm 8A and the top arm 8C are vertical and laterally offset along the Y axis because of the intermediate arm 8B which extends in the lateral direction. The lateral offset allows the front lever 8 to latch with the external body 2 according to two latching points which are laterally offset for a better cooperation. Moreover, the horizontal portion of intermediate arm 8B can be used as a handle to better extract the internal body 3 from the external body 2. The bottom arm 8A is closer to the center of the internal body 3 than the top arm 8C.

As shown in FIG. 7, according to one or more embodiments, the bottom arm 8A comprises the pivot joint 81 and an anti-friction material 82 which is preferably added to the bottom arm 8A around the pivot joint 81 in order to avoids friction during rotation of the front lever 8 along a lateral Y1 axis (FIGS. 8A and 8B). The bottom arm 8A comprises at least one latching tooth 83 for cooperating with the trough opening 230 of the bottom wall 23 of the external body 2 presented before. Thanks to the rotation of the front lever 8, the latching tooth 83 can grab the periphery of the trough opening 230 to pull the internal body 3 within the external body 2. The front lever 8 provides a lift effect which decreases the user hardship.

The top end of the top arm 8C is configured to be manipulated manually by a user without tools. The user can pull the front lever 8 to the front or push the lever 8 to the rear. The top end may be ergonomically designed to allow easy access and manipulation by the user.

As represented in FIGS. 8A and 8B, according to one or more embodiments, the top arm 8C of the front lever 8 comprises an actuator 9 which is configured to be inserted within the through opening 51 (FIG. 9) of the latching wall 5 in order to be retained by the reception element 52 which defines a recess in the back face of the latching wall 5. The actuator 9 is configured to allow disengagement of the front lever 8 upon actuation.

As represented in FIGS. 8A and 8B, according to one or more embodiments, the actuator 9 is pivotally mounted onto the top arm 8C along a lateral axis Y2. The actuator 9 comprises a first end 91 for cooperating with the reception element 52 and a second end 92 configured to be manipulated manually by a user without tools so that to modify the inclination of the actuator 9. In at least one embodiment, the actuator 9 can pivot between an upward position (which corresponds to an engaged position—see FIG. 8A) and a downward position (which corresponds to a disengaged position—see FIG. 8B).

The first end 91 has a shape of a tooth followed by a recess 93. In the engaged position, the reception element 52 of the latching wall 5 is located in the recess 93 of the actuator 9 and the front lever 8 cannot move. In the downward position, the reception element 52 of the latching wall 5 is located in the through opening 51 away from the reception element 52 (See FIG. 9).

In order to secure the engaged position, in at least one embodiment, the lever 8 comprises at least one biasing member 94 configure to maintain the actuator 9 in the engaged position. In at least one embodiment, a spring is embedded within the top arm 8C to maintain the actuator 9 in the upward position.

The front tooth (first end 91) of the actuator 9 has an inclined wall which allows by "corner effect" to move the actuator 9 in the disengaged position against the spring pressure when the front lever 8 is rotated towards the front (in the coupling position). The inclined wall of the front tooth cooperates with the inner periphery of the through opening 51, more precisely with the reception element 52, to exert a downward pressure. When the recess 93 is aligned with the reception element 52, the biasing member 94 moves the actuator 9 in the engaged position. In other words, when the user wants to couple the internal body 3 with the external body 2, the user only requires to rotate the lever 8 towards the front to allow latching, the actuator 9 being automatically moved in the disengaged position and then in the engaged position. The ease of use will be presented for coupling/uncoupling the internal body 3 with the external body 2.

Figure 10:
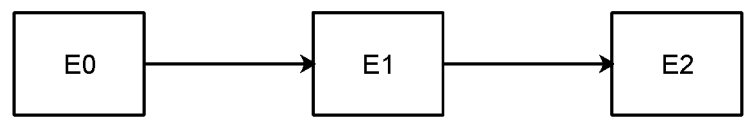
FIG. 10 is a schematic diagram of a method for accessing a secondary component from the internal body of the computing unit, according to one or more embodiments.

It will now be described a method for accessing a second electronic component C2 from the internal body 3, which is faulty, according to one or more embodiments. According to FIG. 10, in the initial position E0, the internal body 3 is located in the housing H1 from the external body 2 (see FIG. 3) and the front lever 8 is latched with the latching wall 5 and with the bottom wall 23 of the external body 3 (see FIG. 6B). The actuator 9 extends in the through opening 51 and its recess 93 cooperates with the reception element 52.

Figure 9:
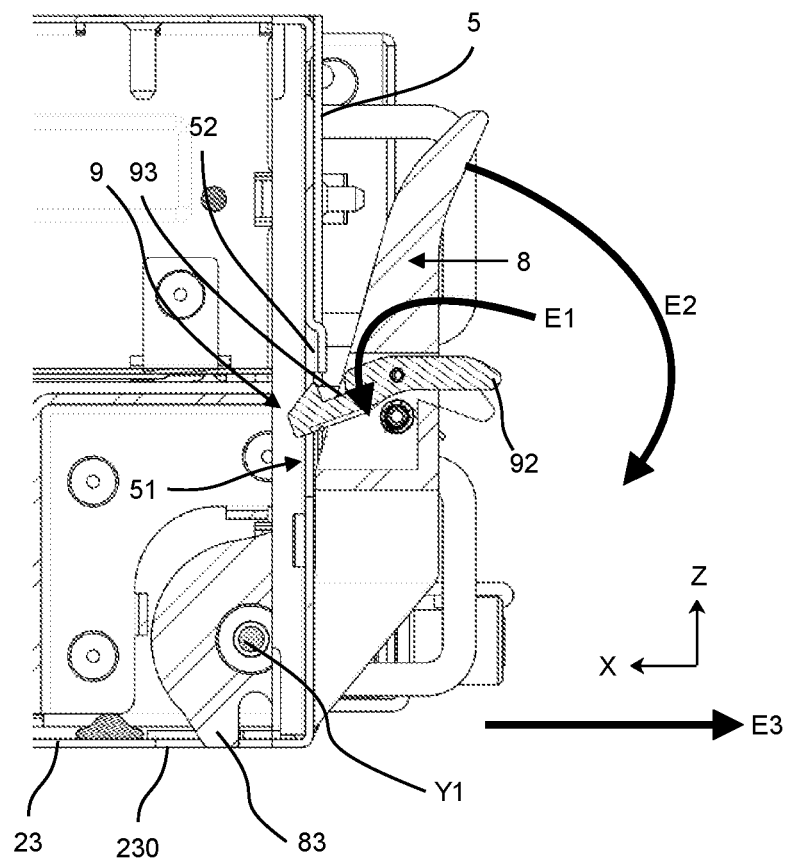
FIG. 9 is a cross-sectional view of the computing unit with the right front lever with the actuator in the disengaged position, according to one or more embodiments.

As illustrated in FIG. 9, in at least one embodiment, the user manipulates E1 the actuator 9 from each front lever 8 in order to disengage each actuator 9 from the reception element 52 of the latching wall 5. Each front lever 8 is therefore free to rotate to the front. The user can then pivot E2 the front lever 8 to unlatch the latching wall 5 and the bottom wall 23 of the external body 2. Then, the user can pull E3 the internal body 3 out from the housing H1 of the external body 2 in order to access the second electronic component C2 from the internal body 3.

In at least one embodiment, the user pulls the front levers 8 in order to pull out the internal body 3. The maintenance can be carried out without wasting time.

Advantageously, in one or more embodiments, the actuators 9 and the front levers 8 can be manipulated by a user simultaneously with his two hands. In other words, the user can disengage the actuators 9, rotate the front levers 8 and pull the front levers 8 very practically.

In order to put back the internal body 3 within the external body 2, the user pushes the internal body 3 within the external body 2, preferably, with the help of the front levers 8. The user can then pivot the front levers 8 to latch automatically the latching wall 5 and the bottom wall 23 of the external body 2. The latching tooth 83 of the front levers 8 allows to progressively tighten the internal body 3 within the external body 2 so that the coupling is very stable. The automatic engagement of the actuator 9 forbids any accidental uncoupling. Thanks to the invention, the computing unit 1 is securely fixed to the HPC cabinet 100 after maintenance.

All terminologies used herein are for purposes of describing embodiments and examples and should not be construed as limiting the invention. As used herein, the singular forms "a," "an," and "the" are configured to include the plural forms as well, unless the context clearly indicates otherwise. Furthermore, to the extent that the terms "including," "includes," "having," "has," "with," or variants thereof, are used in either the detailed description and/or the claims, such terms are configured to be inclusive in a manner similar to the term "comprising."

Unless otherwise defined, all terms (including technical and scientific terms) used herein have the same meaning as commonly understood by the person skilled in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly defined herein.

While aspects of the invention have been particularly shown and described with reference to the embodiments above, it will be understood by those skilled in the art that various additional embodiments may be contemplated by the modification of the disclosed methods without departing from the spirit and scope of what is disclosed. Such embodiments should be understood to fall within the scope of the invention as determined based upon the claims and any equivalents thereof.

What is claimed is:

1. A computing unit configured to be mounted in a High-Performance Computing (HPC) cabinet, defining a plurality of vertically stacked sockets, the computing unit comprising:
   an external body, comprising primary electronic components, configured to engage with at least one of the plurality of vertically stacked sockets,
      wherein the external body further comprises
         at least a bottom wall and two lateral walls defining a front housing opened from a front end of said external body and a back housing at a rear end, each lateral side of said two lateral walls comprising an abutment wall configured to be secured directly to the HPC cabinet, and
         a latching wall located in front of the abutment wall,
      wherein said latching wall and said abutment wall are longitudinally spaced apart by a distance along an X axis, such that said latching wall is parallel to the abutment wall and extends along an entire height of said computing unit,
      wherein said abutment wall of said each lateral side is located at said front end of said external body,
      wherein said abutment wall of said each lateral side extends laterally from said each lateral side and extends vertically in a YZ plane along said entire height of said computing unit,
      wherein the external body further comprises at least a first connector connected to the primary electronic components,
   an internal body, comprising secondary electronic components, being releasably coupled with the external body at the primary electronic components from said back housing in order to allow extraction of the internal body when the external body is secured fixedly to the HPC cabinet,
      wherein the internal body further comprises at least a second connector connected to the secondary electronic components, the second connector being configured to cooperate with the first connector when the internal body is coupled with the external body,
   at least one front lever pivotally coupled to the internal body along a lateral axis at said front end of the internal body such that the at least one front lever is configured to move from a rear position comprising an uncoupling position to a front position comprising a coupling position, and configured to latch with the latching wall of the external body and to latch with the bottom wall of the external body such that the at least one front lever is pivotably deflected in order to releasably couple the internal body from the external body when the internal body is located within the front housing of the external body and configured to enable a user to push the internal body back into the external body, without use of any external tools.

2. The computing unit according to claim 1, wherein the latching wall comprises at least a reception element defining a recess, located on a back face of the latching wall, configured to cooperate with the at least one front lever.

3. The computing unit according to claim 2, wherein the latching wall comprises at least one through opening located on each side of said bottom wall such that each front lever of said at least one front lever latches with said external body according to two latching points, wherein said at least one through opening comprises a notch, and wherein said reception element is located at a periphery of the at least one through opening of the latching wall, such that a part of the at least one front lever is securely located in said recess when said internal body is coupled with said external body.

4. The computing unit according to claim 3, wherein the abutment wall comprises at least a locking member accessible from the front end of the computing unit through the at least one through opening.

5. The computing unit according to claim 1, wherein the at least one front lever comprises at least an actuator comprising a first end for cooperating with the latching wall and a second end configured to be manipulated manually by said user without said external tools to modify an inclination of the actuator, wherein the actuator is pivotable between an engaged position for securing the internal body to the external body and a disengaged position.

6. The computing unit according to claim 5, wherein the at least one front lever comprises at least a biasing member configured to retain the actuator in the engaged position.

7. The computing unit according to claim 6, wherein the bottom wall comprises at least one through opening and the at least one front lever comprises at least a latching tooth configured to cooperate with the at least one through opening in order to push the internal body within the external body when rotating the at least one front lever to a rear position.

8. The computing unit according to claim 1, wherein the at least one front lever comprises a bottom arm configured to latch with the bottom wall and a top arm configured to latch with the latching wall of the external body.

9. The computing unit according to claim 8, wherein the bottom arm and the top arm of the at least one front lever are laterally offset to allow said at least one front lever to latch with the external body according to two latching points which are laterally offset.

10. The computing unit according to claim 1, wherein the at least one front lever comprises two front levers, one at each side of the internal body.

11. The computing unit according to claim 1, wherein said latching wall comprises a through opening, and wherein each front lever of said at least one front lever comprises
   a bottom arm with a pivot joint,
   an intermediate arm, and
   a top arm with an actuator,
      wherein said actuator
         is pivotally mounted on said top arm,
         is in said through opening of said latching wall to cooperate with said latching wall of the external body,
         comprises a first end and a second end, wherein said first end comprises a front tooth with an inclined wall, such that said inclined wall cooperates with an inner periphery of said through opening of said latching member;
wherein said bottom arm and said top arm are vertically and laterally offset along a Y axis;
wherein said bottom arm is closer to a center of said internal body than said top arm;
wherein said bottom arm comprises at least one latching tooth that cooperates with a through opening of the bottom wall of the external body.

12. A method for accessing a second electronic component from an internal body of a computing unit configured to be mounted in a High-Performance Computing (HPC) cabinet, defining a plurality of vertically stacked sockets, wherein the computing unit comprises an external body, comprising primary electronic components, configured to engage with at least one of the plurality of vertically stacked sockets,
  wherein the external body further comprises at least a bottom wall and two lateral walls defining a front housing opened from a front end of said external body and a back housing at a rear end, each lateral side of said two lateral walls comprising an abutment wall configured to be secured directly to the HPC cabinet, and
  a latching wall located in front of the abutment wall,
  wherein said latching wall and said abutment wall are longitudinally spaced apart by a distance along an X axis, such that said latching wall is parallel to the abutment wall and extends along an entire height of said computing unit,
  wherein said abutment wall of said each lateral side is located at said front end of said external body,
  wherein said abutment wall of said each lateral side extends laterally from said each lateral side and extends vertically in a YZ plane along said entire height of said computing unit,
  wherein the external body further comprises at least a first connector connected to the primary electronic components,
the internal body, comprising secondary electronic components, being releasably coupled with the external body at the primary electronic components from said back housing in order to allow extraction of the internal body when the external body is secured fixedly to the HPC cabinet,
  wherein the internal body further comprises at least a second connector connected to the secondary electronic components, the second connector being configured to cooperate with the first connector when the internal body is coupled with the external body,
at least one front lever pivotally coupled to the internal body along a lateral axis at said front end of the internal body such that the at least one front lever is configured to move from a rear position comprising an uncoupling position to a front position comprising a coupling position, and configured to latch with the latching wall of the external body and to latch with the bottom wall of the external body such that the at least one front lever is pivotably deflected in order to releasably couple the internal body from the external body when the internal body is located within the front housing of the external body and configured to enable a user to push the internal body back into the external body, without use of any external tools,
  wherein the internal body is located in the front housing of the external body, and wherein the at least one front lever is latched with the latching wall of the external body,
wherein the method comprises:
pivoting the at least one front lever to unlatch the external body, and
pulling the internal body out from the housing of the external body in order to access the second electronic component from the internal body.

* * * * *